United States Patent
Zhang et al.

(10) Patent No.: US 12,446,378 B2
(45) Date of Patent: Oct. 14, 2025

(54) CURRENT SPREADING STRUCTURE FOR LIGHT-EMITTING DIODE

(71) Applicant: BOLB Inc., Livermore, CA (US)

(72) Inventors: Jianping Zhang, Arcadia, CA (US); Ying Gao, Fremont, CA (US); Ling Zhou, Dublin, CA (US)

(73) Assignee: BOLB Inc., Livermore, CA (US)

( * ) Notice: Subject to any disclaimer, the term of this patent is extended or adjusted under 35 U.S.C. 154(b) by 492 days.

(21) Appl. No.: 17/936,802

(22) Filed: Sep. 29, 2022

(65) Prior Publication Data
US 2024/0128419 A1    Apr. 18, 2024

(51) Int. Cl.
*H10H 20/857* (2025.01)
*H10H 20/816* (2025.01)
*H10H 20/852* (2025.01)

(52) U.S. Cl.
CPC ........ *H10H 20/857* (2025.01); *H10H 20/852* (2025.01)

(58) Field of Classification Search
CPC ........ H01L 23/5228; H10H 20/83–835; H10H 20/816–8162; H10H 29/832–8325; H10H 29/032
See application file for complete search history.

(56) References Cited

U.S. PATENT DOCUMENTS

| | | | |
|---|---|---|---|
| 6,956,884 B1 * | 10/2005 | Nomura | B82Y 20/00 372/46.01 |
| 7,998,771 B2 | 8/2011 | Bae | |
| 8,330,174 B2 | 12/2012 | Sabathil et al. | |
| 8,501,513 B2 | 8/2013 | Ahlstedt et al. | |
| 9,705,033 B2 | 7/2017 | Yeh et al. | |

(Continued)

FOREIGN PATENT DOCUMENTS

| | | | |
|---|---|---|---|
| CN | 104900775 A | 9/2015 | |
| DE | 102019100799 A1 * | 7/2020 | ............ H01L 33/42 |

(Continued)

OTHER PUBLICATIONS

Serway et al, "Physics for Scientists and Engineers with Modern Physics", 7th edition, Thomson, Brooks/Cole, 2008—Section 27.3 p. 757.*

(Continued)

*Primary Examiner* — Joshua Benitez Rosario
*Assistant Examiner* — Moataz Khalifa
(74) *Attorney, Agent, or Firm* — Cooley LLP

(57) ABSTRACT

An apparatus has a current spreading base with an n-contact. The current spreading base has a small n-type resistivity to promote lateral electron flow. A current spreading cap is on top of the current spreading base. The current spreading cap has a large n-type resistivity to suppress vertical electron flow and promote lateral electron flow. An active region is on top of the current spreading cap. A p-type structure is on top of the active region with a p-contact. Sheet resistance $R_{n\square}$ of the current spreading base is experimentally established, the half width $x_F$ of a mesa is selected and the current spreading cap thickness $h_c$ is selected to collectively promote uniform current injection into the active region.

20 Claims, 12 Drawing Sheets

(56) References Cited

U.S. PATENT DOCUMENTS

| | | | |
|---|---|---|---|
| 2011/0272719 A1 | 11/2011 | Chen et al. | |
| 2013/0292645 A1* | 11/2013 | Yun | H10H 20/835 |
| | | | 257/13 |
| 2018/0254371 A1* | 9/2018 | Zhang | H10F 30/225 |
| 2020/0013925 A1 | 1/2020 | Sung et al. | |
| 2020/0287086 A1* | 9/2020 | Zhang | H10F 77/1243 |
| 2021/0074880 A1 | 3/2021 | Gao et al. | |

FOREIGN PATENT DOCUMENTS

| | | |
|---|---|---|
| EP | 2743996 A2 | 6/2014 |
| KR | 20160027644 A | 3/2016 |
| KR | 102330026 B1 * | 11/2021 |

OTHER PUBLICATIONS

Extended European Search Report for European Application No. EP23200667.6 dated Mar. 25, 2024, 8 pages.

Nakarmi, et al., Transport properties of highly conductive n-type Al-rich Al x Ga 1-x N (x> 0.7), Applied Physics Letters, Oct. 2004, pp. 3769-3771.

* cited by examiner

CURRENT SPREADING STRUCTURE FOR LIGHT-EMITTING DIODE

FIELD OF THE INVENTION

The present invention relates to light-emitting diodes. More particularly, the invention is directed to current spreading structures for group-III nitride light-emitting diodes.

DESCRIPTION OF THE RELATED ART

A general light-emitting diode (LED) is illustrated in FIG. 1, including a light-emitting structure having an n-layer, a p-layer and an active-region inserted in-between the n-layer and p-layer. An n-layer is a layer doped with n-type dopant. Similarly, a p-layer is a layer doped with p-type dopant. The light-emitting structure can be formed on a substrate or a template, and an n-contact and a p-contact are formed on the n-layer and p-layer, respectively. In order to form the n-contact to the n-layer, a standard LED lithography and etch process is employed to remove parts of the p-layer and active-region so that a light-emitting mesa is formed and part of the n-layer is exposed for the n-contact formation. The p-contact and n-contact are made of proper metal layers and form ohmic contacts to the p-layer and n-layer, respectively. As shown in FIG. 1, the p-contact covers the whole light-emitting mesa area, so that the top portion of the p-layer is made equipotential by the p-contact. Holes therefore can be uniformly and vertically injected into the active-region from the p-layer. However, the n-contact is only formed on a part of the n-layer. Electrons injected by the n-contact therefore need to move transversely or laterally in order to flow into the active-region. During operation, a positive voltage is exerted to the p-contact relative to the n-contact, so that holes and electrons are respectively injected into the active-region from the p- and n-layers, to recombine to emit light.

Also shown in FIG. 1 is an equivalent circuit of the LED, including many diodes ($D_1$, $D_2$, . . . , $D_i$) resistances in the n-layer ($R_{n1}$, $R_{n2}$, . . . , $R_{ni}$), and resistances in the p-layer ($R_{p1}$, $R_{p2}$, . . . , $R_{pi}$). Note that the illustration in FIG. 1 is not drawn to scale. The lateral dimension is actually much larger than the vertical dimension. In general, the mesa shown in FIG. 1 can be of a width tens up to a few hundred microns, and height only a few hundred nanometers. Therefore, the total lateral resistance ($R_\parallel = \Sigma_k R_{nk}$) is much larger than the total vertical resistance $$\left( R_\perp = \frac{1}{\Sigma_k \frac{1}{R_{pk}}} \right),$$

and electrons tend to flow into the active-region along the mesa edge close to the n-contact, resulting in a current crowding effect in the mesa edge close to the n-contact. This current crowding effect is detrimental to the LED efficiency and reliability.

In the prior art, there are practices to mitigate the current crowding effect, basically via incorporation of a current spreading feature into the LEDs. Examples can be found in the U.S. Pat. Nos. 8,330,174, 9,705,033, 7,998,771, and 8,501,513. The prior art practices are, however, purely empirical. There lacks a clear design rule of the current spreading features in the prior art, and it is difficult to predict the effectiveness of the prior art designs.

The current crowding effect is expected to be severer for ultraviolet (UV) LEDs. UV LEDs with optical emission wavelengths less than 360 nm are made of group-III nitride compound semiconductors such as AlGaN alloys. A typical UV LED includes a UV transparent substrate (e.g.: sapphire) and an AlN layer formed on the substrate. This AlN layer serves as an epitaxial template to support a UV light-emitting structure, which typically includes an n-type AlGaN structure, a p-type AlGaN structure, and a light-emitting region or active-region commonly made of AlGaN multiple-quantum-well (MQW) sandwiched in-between the n-type and p-type AlGaN structures. An AlGaN structure can be made of an AlGaN layer or many AlGaN layers joint forces to deliver a better function, such as to improve material quality, conductivity and/or carrier confinement. The Al-contents in the AlGaN layers/structures determine the optical emission wavelength of the UV LEDs. The optical emissions of wavelength less than 280 nm possess strong germicidal effect, making them ideal for food, water, air and surface disinfections.

For UV C-band (UVC) LEDs of emissions in the range of 200-280 nm, the Al-content (x) of the n-type $Al_xGa_{1-x}N$ structure needs to be in the range of 0.55-1 (i.e., $x \in [55\%$-$100\%]$). The donor activation energies in such $Al_xGa_{1-x}N$ layers increase quickly with x, making the dopant activation efficiency hence the conductivity drops exponentially with the Al-content (see, e.g., M. L. Nakarmi et al, Appl. Phys. Lett. 85,3769 (2004)). Because of this limited conductivity of the n-type AlGaN structures, UVC LEDs usually suffer severer current crowding effect as compared to GaN-based visible LEDs.

Thus, there is a need for general design rules to mitigate LED current crowding effect for various UV LED embodiments with uniform current injections.

SUMMARY OF THE INVENTION

An apparatus has a current spreading base with an n-contact. The current spreading base has a small n-type resistivity to promote lateral electron flow. A current spreading cap is on top of the current spreading base. The current spreading cap has a large n-type resistivity to suppress vertical electron flow and promote lateral electron flow. An active region is on top of the current spreading cap. A p-type structure is on top of the active region with a p-contact. Sheet resistance $R_{n\square}$ of the current spreading base is experimentally established, the half width $x_F$ of a mesa is selected and the current spreading cap thickness $h_c$ is selected to collectively promote uniform current injection into the active region.

BRIEF DESCRIPTION OF THE DRAWINGS

The accompanying drawings, which are included to provide a further understanding of the invention and constitute a part of this application, illustrate embodiments of the invention and together with the description serve to explain the principle of the invention. Like reference numbers in the figures refer to like elements throughout, and a layer can refer to a group of layers associated with the same function.

DETAILED DESCRIPTION OF EMBODIMENTS

Figure 1:
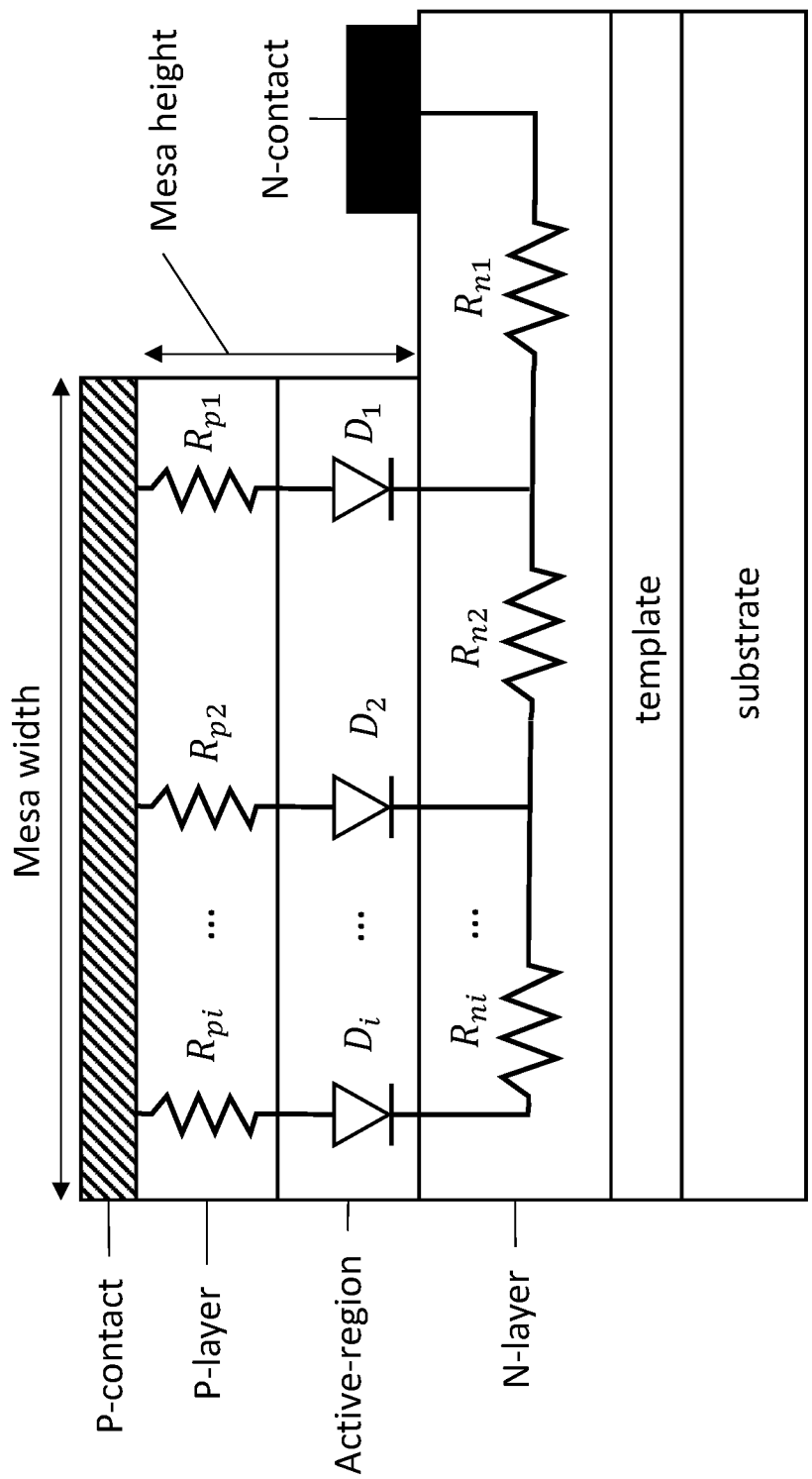
FIG. 1 illustrates a laminate structure of a prior art LED, together with an equivalent circuit.

Throughout the specification, the term group III nitride in general refers to metal nitride with cations selecting from group IIIA of the periodic table of elements. That is to say, III-nitride includes BN, AlN, GaN, InN and their ternary (e.g., AlGaN, InGaN, InAlN, et al) and quaternary (e.g., AlInGaN, BAlGaN, et al) alloys. In this specification, a quaternary can be reduced to a ternary for simplicity if one of the group III elements is significantly small so that its existence does not affect the intended function of a layer made of such material. For example, if the In-composition in a quaternary AlInGaN is significantly small, smaller than 1%, then this AlInGaN quaternary can be shown as ternary AlGaN for simplicity. Using the same logic, a ternary can be reduced to a binary for simplicity if one of the group III elements is significantly small. For example, if the In-composition in a ternary InGaN is significantly small, smaller than 1%, then this InGaN ternary can be shown as binary GaN for simplicity. Group III nitride may also include a small amount of transition metal nitride such as TiN, ZrN, HfN with molar fraction not larger than 10%. For example, III-nitride or nitride may include $Al_xIn_yGa_zTi_{1-x-y-z}$, $Al_xIn_yGa_zZr_{(1-x-y-z)}N$, $Al_xIn_yGa_zHf_{(1-x-y-z)}N$, with $(1-x-y-z) \leq 10\%$. The bandgap of a group III nitride is determined by its composition. For examples, the bandgaps of InN, GaN, and AlN at room-temperature are 0.7, 3.4, and 6.2 eV, respectively. The bandgap of an AlGaN alloy increases with its Al-composition (or, Al-content).

As well known, blue, green and UV light-emitting devices such as light-emitting diodes (LEDs) commonly adopt a laminate light-emitting structure containing a quantum well active region, an n-type group III nitride structure on one side of the active-region for injecting electrons into the active region, and a p-type group III nitride structure on the other side of the active region for injecting holes into the active region. This light-emitting structure is generally formed over a substrate, which can be selected from silicon (Si), silicon carbide (SiC), AlN and sapphire. In consideration of cost, commercial viability and UV transparency, sapphire, usually c-plane sapphire is the number one choice of selection for visible and UV LEDs. A c-plane sapphire substrate has a (0002) plane to receive epitaxial growth layers.

An LED also includes at least a metal p-contact and at least a metal n-contact formed on the p-type and n-type structures, respectively. For the sake of light extraction, the n-contacts optionally are only formed on a portion of the n-type layers, as a result, electrons injected from the n-contacts need to transport laterally in the n-type layers so that uniform electron injection into the active region can be realized. One aspect of the present invention provides an n-type structure which is a current spreading structure for an LED. The current spreading structure includes a current spreading base and a current spreading cap, wherein the current spreading base optionally include a high bandgap ($E_g$) layer and a low bandgap layer, and the n-contacts are formed on the low bandgap layer of the current spreading base, and the bandgap of the current spreading cap is higher than that of the low bandgap layer of the current spreading base, the resistivity of the current spreading cap is at least 1000 times that of the current spreading base.

Figure 2A:
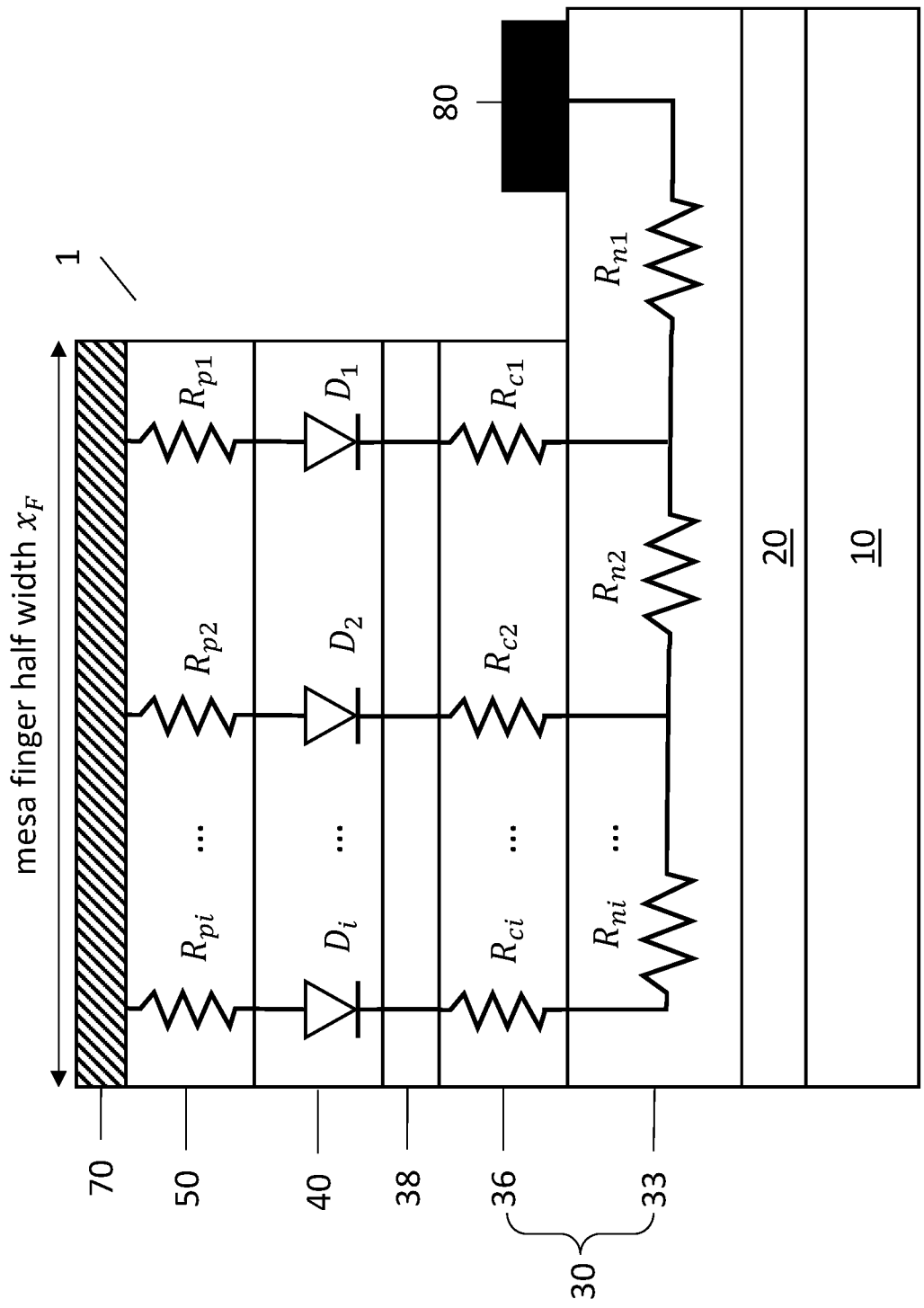
FIG. 2A illustrates a laminate structure of a lateral LED according to this disclosure, together with an equivalent circuit.

A laminate or layered structure of a LED according to one aspect of the present disclosure is given in FIG. 2A. The LED structure is formed on substrate 10, which can be selected from Si, SiC, AlN and sapphire. A template 20 is then formed on substrate 10. Template 20 can be made of AlN or undoped GaN. For UV LEDs, optionally, template 20 is an AlN layer. Formed over template 20 is a current spreading structure 30, which is generally an n-type structure and includes a current spreading base 33 and a current spreading cap 36. Base 33 optionally has good n-type conductivity, i.e., being of small n-type resistivity, so that electrons can have sufficient lateral flow capability. Cap 36 optionally has much higher n-type resistivity, so that it can suppress electrons' vertical flow and enforce their lateral flow. Base 33 and cap 36 can be respectively made of one layer or many layers in order to implement their respective functionalities.

Formed over current spreading structure 30 is active-region 40, and formed on active-region 40 is p-type structure 50. Optionally, in-between active-region 40 and current spreading structure 30 there is an n-type layer 38, which is optionally doped with Si to a high concentration, e.g, $8.0 \times 10^{18}$-$2.0 \times 10^{19}$ cm$^{-3}$, to provide good screening effect for the electric field within the active-region 40.

Figure 2B:
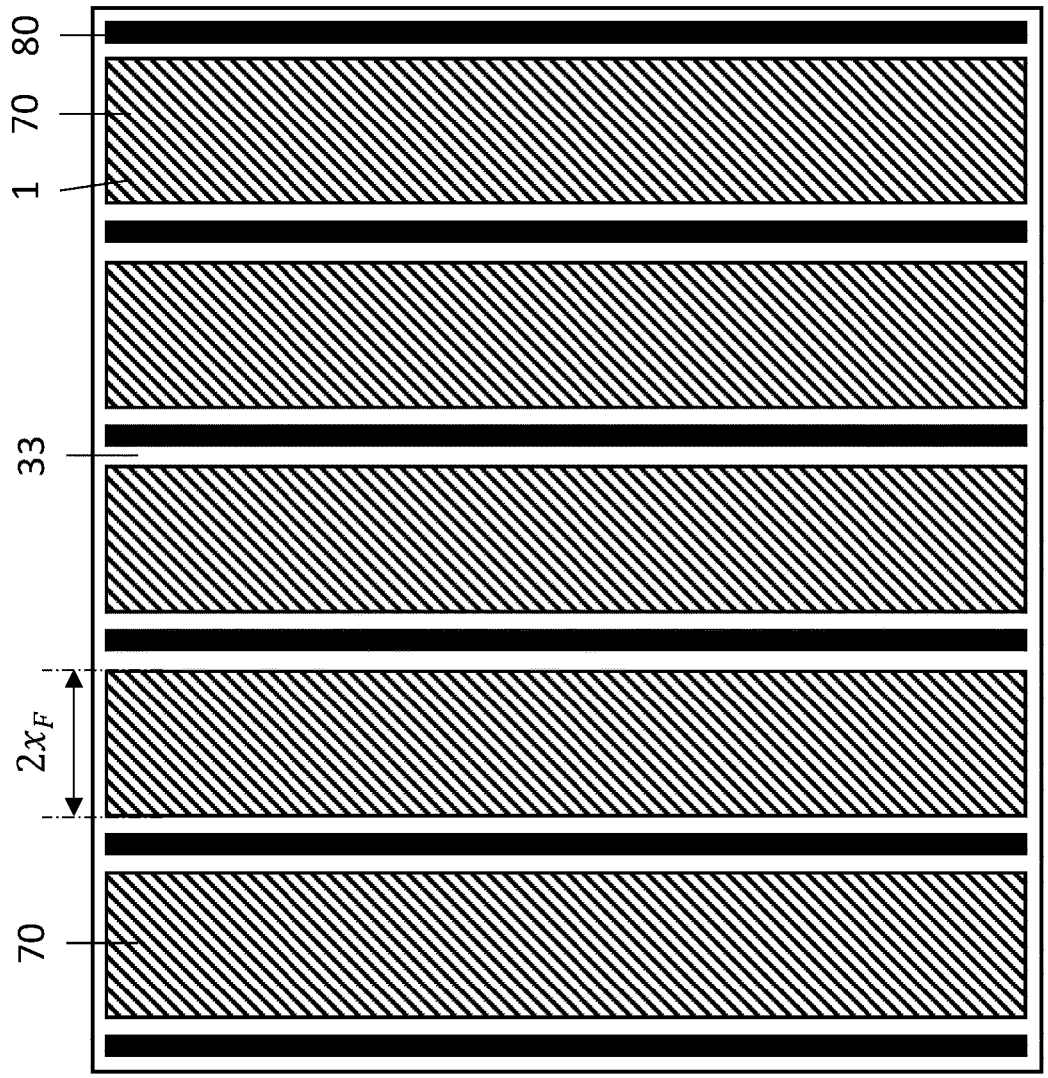
FIG. 2B illustrates a plan view of a lateral LED with a laminate structure given in FIG. 2A.

Finally, p-contact 70 and n-contact 80 are formed on p-type structure 50 and current spreading base 33, respectively. P-contact 70 (n-contact 80) may include a p-ohmic (n-ohmic) contact layer and a thick metal probe layer. In order to access base 33, light-emitting mesa 1 has to be formed via etching part of the p-type structure 50, active-region 40, n-type layer 38, and cap 36 to expose part of base 33 on which n-contact 80 can be formed. A plan view of the LED having the laminate structure shown in FIG. 2A is given in FIG. 2B. As seen, the light-emitting area of the LED is made of many (5 shown in FIG. 2B) finger-type light-emitting mesas 1 (covered by p-contacts 70), each of a half width $x_F$ (i.e., finger mesa width $2x_F$). The LED embodiments shown in FIGS. 2A and 2B can be called lateral LEDs, as electrons injected from n-contact 80 need to move laterally along current spreading base 33 so that they can be injected more uniformly into active-region 40 defined by mesas 1.

Figure 3:
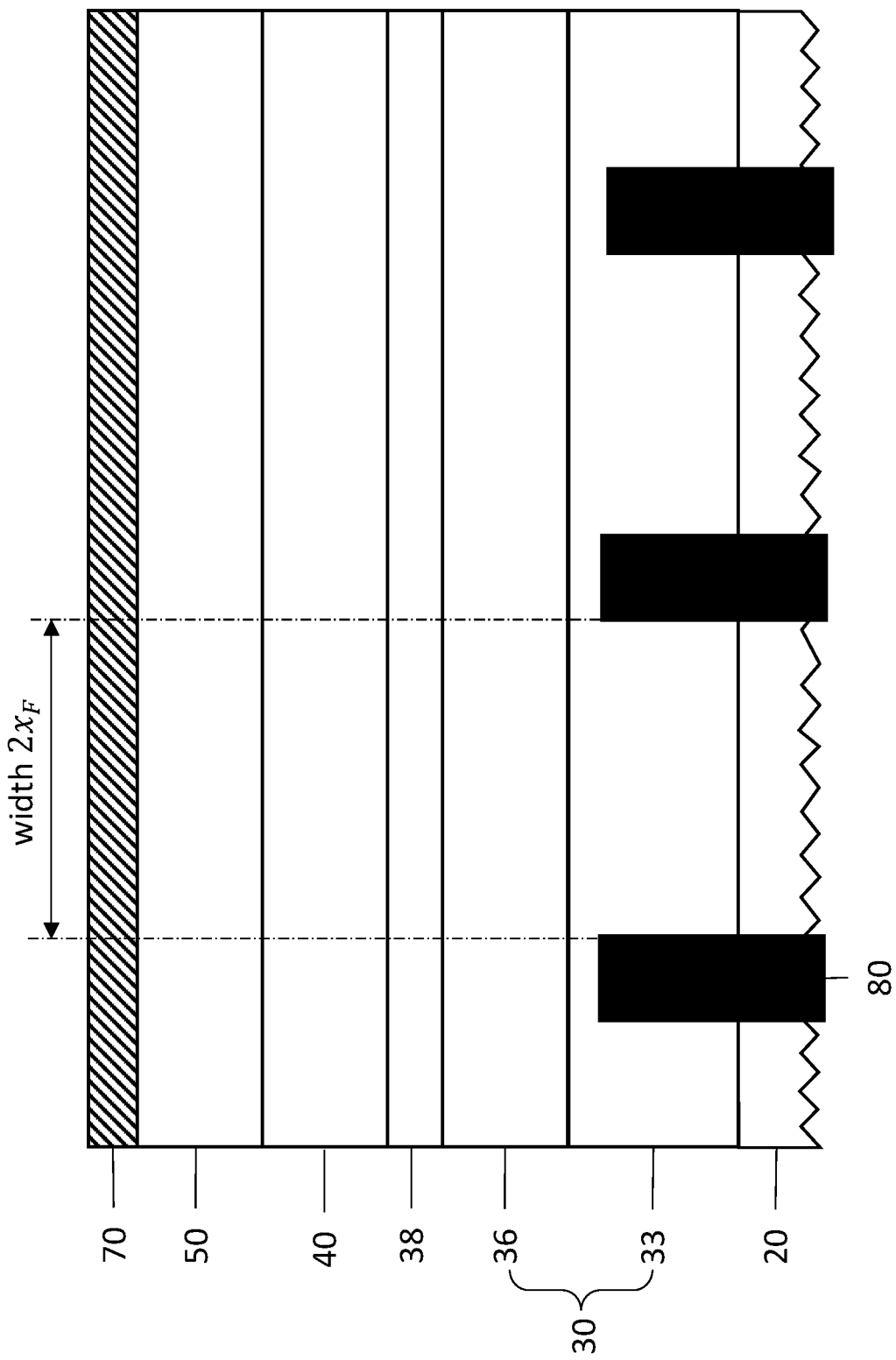
FIG. 3 illustrates a laminate structure of a vertical LED according to this disclosure.

Another LED embodiment which can be called a vertical LED according to this disclosure is illustrated in FIG. 3. In comparison to the LED embodiment given in FIG. 2A, in this vertical LED embodiment, substrate 10 is removed, and the exposed surface of template 20 is roughened for better light extraction, and n-contacts 80 are formed into the current spreading base 33. Electrons injected from n-contacts 80 have a great portion that can be injected vertically into the active-region 40. Still, there are regions in active-region 40 that need electrons to be injected laterally. These regions are of width $2x_F$, as shown in FIG. 3, being out of the vertical projections of n-contacts 80.

Another aspect of the present invention is to design the current spreading structure 30 so that electrons injected from the n-contacts 80 can flow uniformly into the active-region 40 beneath the p-contacts 70. This requires current spreading structure 30 to be of well-balanced lateral conduction to its vertical conduction.

The resistivity (ρ) of a semiconductor layer can be calculated as $$\rho = \frac{1}{qn\mu},$$

where q, n, and μ are electron's elementary charge, carrier concentration, and carrier mobility, respectively. For a laminate structure made of many layers (1, 2, 3, ..., i, ...), if layer i is of thickness $h_i$ and resistivity $\rho_i$, the thickness of the laminate structure is $h_n = \Sigma_i h_i$. Suppose that $h_n$ is significantly less than the lateral dimension of the laminate structure, these layers then can be viewed as electrically connected in parallel, and the resistivity of the laminate structure thus can be calculated as $$\rho_n = \frac{\sum_i h_i}{\sum_i \frac{h_i}{\rho_i}}.$$

Figure 4:
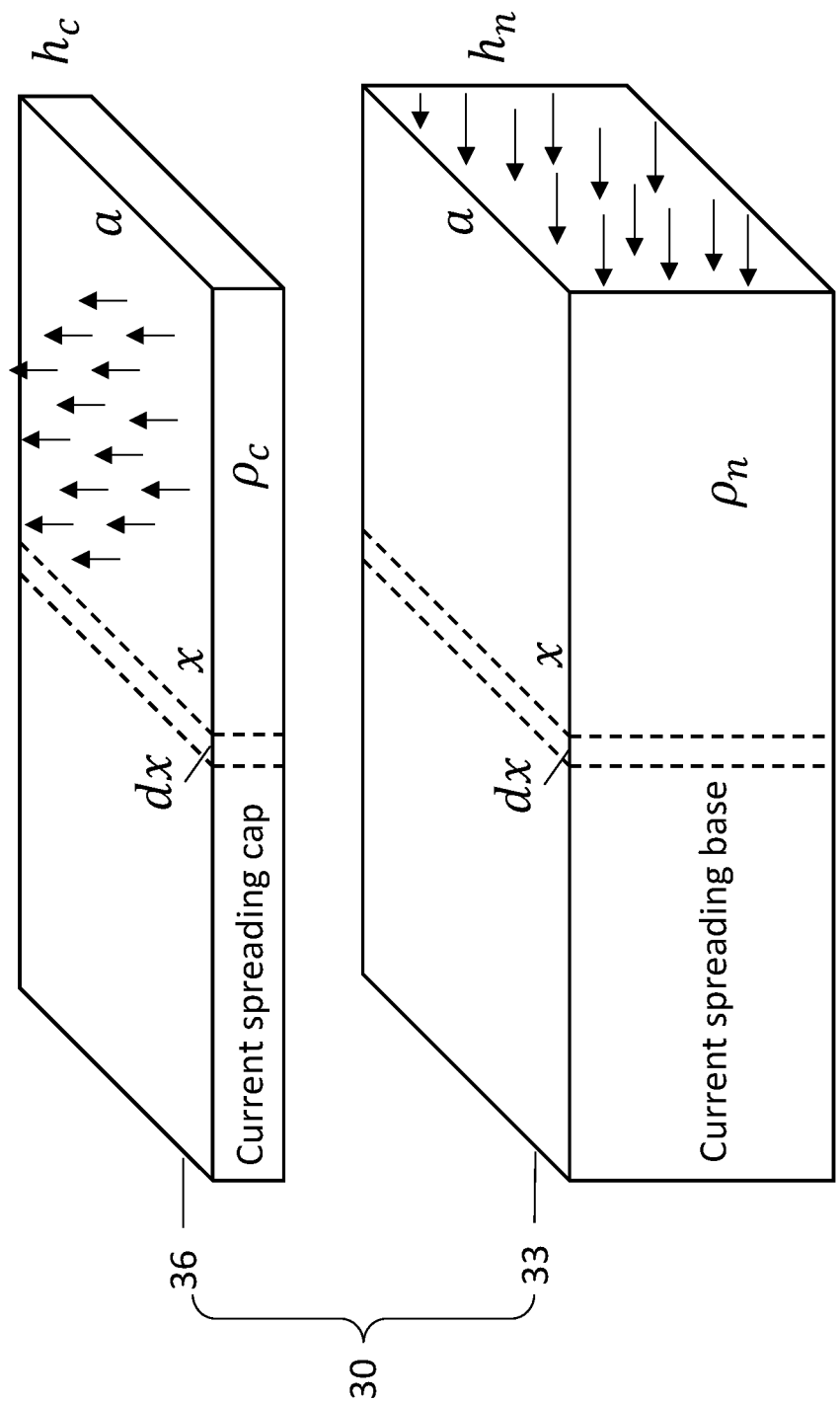
FIG. 4 illustrate a current spreading structure according to this disclosure, including a current spreading base and a current spreading cap.

Consider the electrical current generated by electron flows in the base 33 and cap 36. In order to have a better understanding, the current spreading structure 30 is illustrated in an exploded view in FIG. 4, where the electron flows are indicated by arrows. Cap 36 is of thickness $h_c$ and resistivity $\rho_c$, and base 33 is of thickness $h_n$ and resistivity $\rho_n$. Suppose the light-emitting mesa is defined with a length a and half width $x_F$ (e.g., seen in FIGS. 2A and 2B). After electrons being injected from n-contact 80, they will first flow laterally in the base 33 towards mesa 1. Once reaching mesa 1, the electrons will sense the resistance variations in all directions, namely, in the lateral and vertical directions. On their way transversely to the left (x increases), they sense the changes of the lateral and vertical resistances to be $$\frac{dR_\parallel}{dx} = \rho_n \frac{dx}{ah_n} \text{ and } \frac{dR_\perp}{dx} = -\rho_c \frac{h_c dx}{ax^2},$$

respectively.

If $$\frac{dR_\parallel}{dx} + \frac{dR_\perp}{dx} > 0,$$

electrons will prefer to flow vertically into the current spreading cap and active-region 40. If $$\frac{dR_\parallel}{dx} + \frac{dR_\perp}{dx} \leq 0,$$

the majority or electrons will keep flowing left (laterally), resulting in uniform electron injection into the active region 40 defined by the light-emitting mesa 1. This requires an inequality (1) to hold:

$$\rho_c \geq R_{n\square} \frac{x_F^2}{h_c} \quad (1)$$

where $$R_{n\square} = \frac{\rho_n}{h_n}$$

is the sheet resistance of the current spreading base 33. Inequality (1) tells, that in order to have uniform electron injection into the active region 40 defined by the light-emitting mesa 1, the required minimal resistivity of the current spreading cap 36 needs to be proportional to $R_{n\square}$ and $x_F^2$, and inversely proportional to $h_c$. Hence, according to one aspect of the present invention, we can design and select the resistivity $\rho_c$ of the current spreading cap according to inequality (1), with experimentally known parameters such as the sheet resistance $R_{n\square}$ of the current spreading base, the designed mesa half width $x_F$, and the desired cap thickness $h_c$.

The addition of the cap 36 can result in a forward voltage increase ($\Delta V_F$), which depends on the p-n junction area (A) and forward current (I), which is given by equation (2):

$$\Delta V_F = I\rho_c \frac{h_c}{A} \quad (2)$$

In practice, the desired $\Delta V_F$ is limited to less than 0.5 V, or less than 0.3 V, or less than 0.2 V.

Figure 5A:
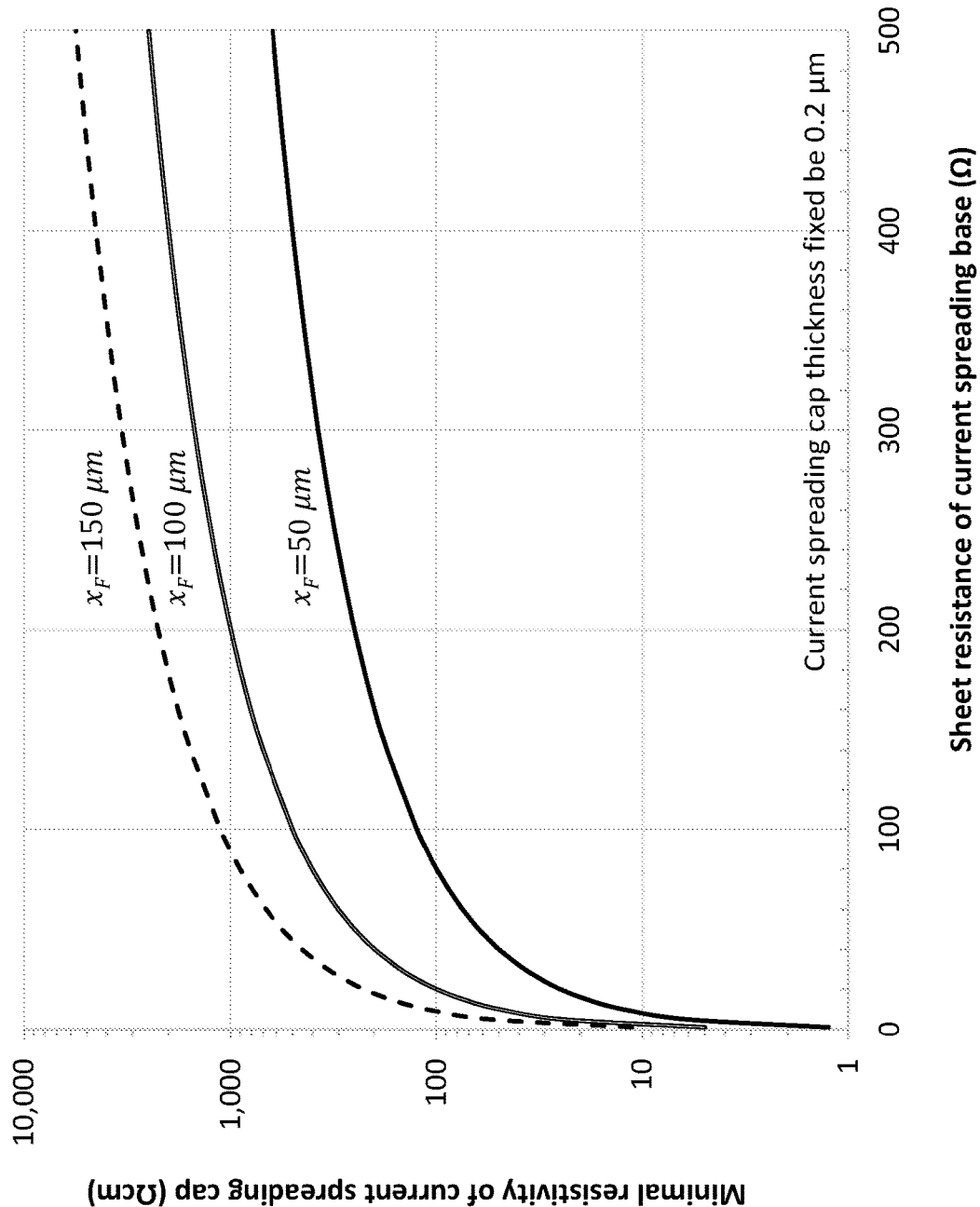
FIG. 5A plots the required minimal resistivity of the current spreading cap as a function of the sheet resistance of the current spreading base for three different mesa half widths.

FIG. 5A is a plot of the required minimal resistivity of the current spreading cap 36 for uniform electron injection into the active-region 40 defined by mesa 1, as a function of the sheet resistance of the current spreading base 33 for three different mesa half widths (50, 100, and 150 μm). The thickness of the current spreading cap is fixed to be 0.2 μm. For the same sheet resistance of the current spreading bases 33, the wider the mesa half width is, the larger the minimal resistivity of the current spreading cap. Also, the larger the sheet resistance of the current spreading base 33, the higher the minimal resistivity of the current spreading cap 36. For example, if $R_{n\square}=10\Omega$ (e.g., for visible LEDs), the required minimal $\rho_c$ are approximately 12.5, 50, and 112.5 Ωcm for the mesa half width of 50, 100, and 150 μm, respectively; if $R_{n\square}=80\Omega$ (e.g., for UVC LEDs), the required minimal $\rho_c$ are approximately 100, 400, and 900 Ωcm for the mesa half width of 50, 100, and 150 µm, respectively. Therefore, according to one aspect of the present disclosure, if the current spreading base is of sheet resistance in the range of 10-500Ω, the current spreading cap is selected to be of resistivity in the range of 10-6000 Ωcm. In terms of resistivity, as a rule of thumb, the resistivity of the current spreading cap is at least 1000 times that of the current spreading base.

Figure 5B:
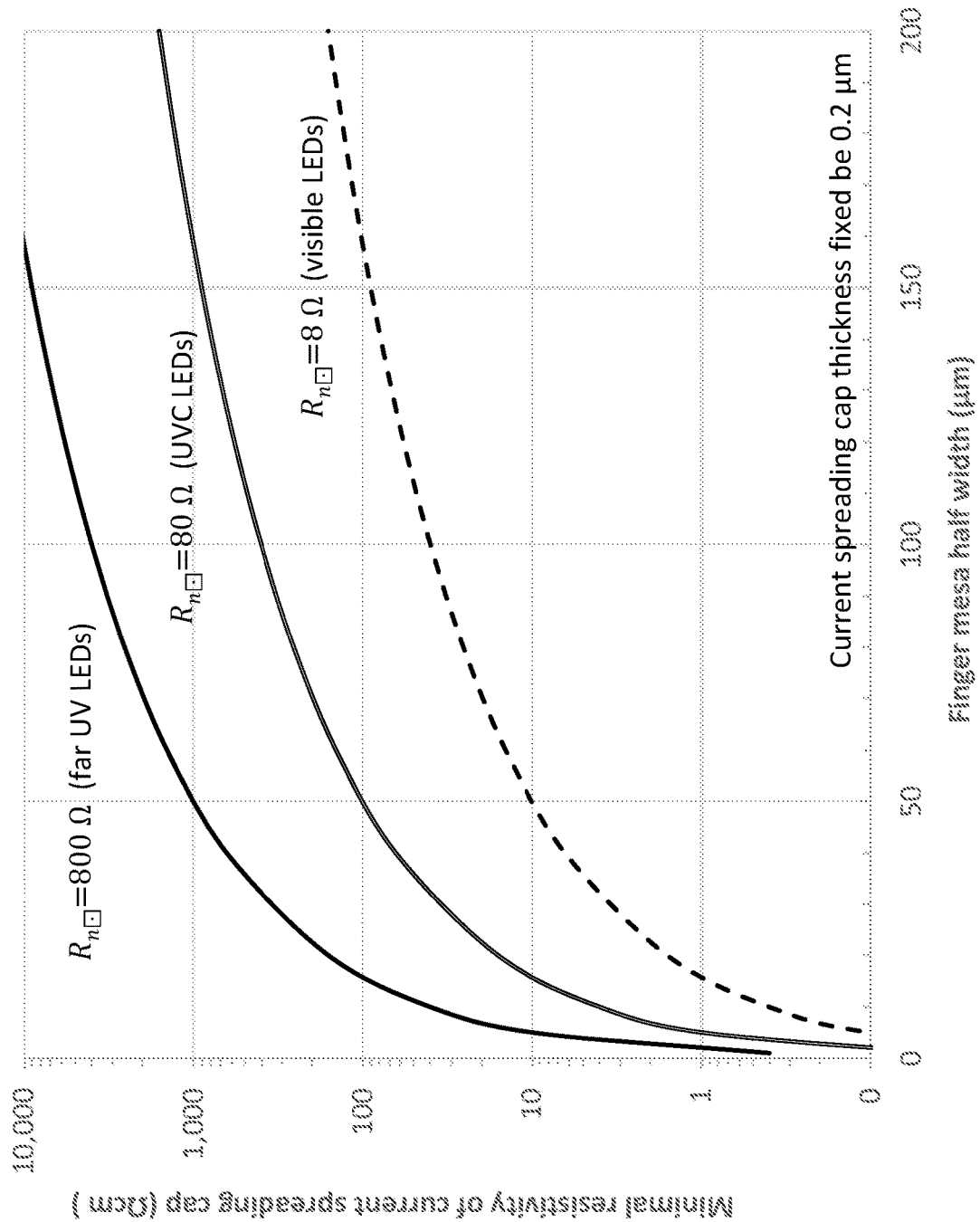
FIG. 5B plots the required minimal resistivity of the current spreading cap as function of the finger mesa half width for three different current spreading base sheet resistances.

FIG. 5B plots the required minimal resistivity of the current spreading cap for uniform electron injection into the active-region 40 defined by mesa 1, as a function of the light-emitting mesa (e.g., mesa 1 in FIGS. 2A and 2B) finger half width for current spreading bases of three sheet resistances (8, 80, and 800Ω). Here the thickness of the current spreading cap is fixed to be 0.2 µm. In order to make electrons spread into larger lateral distances to have larger mesa half width $x_F$, we need to have higher resistivity for the current spreading cap 36. For example, if $R_{n\square}=8\Omega$ (e.g., for visible LEDs), the required minimal $\rho_c$ are approximately 10, 40, and 90 Ωcm for $x_F$ being of 50, 100, and 150 µm, respectively; if $R_{n\square}=80\Omega$ (e.g., for UVC LEDs), the required minimal $\rho_c$ are approximately 100, 400, and 900 Ωcm for $x_F$ being of 50, 100, and 150 µm, respectively; if $R_{n\square}=800\Omega$ (e.g., for far UV LEDs), the required minimal $\rho_c$ are approximately 1000, 4000, and 9000 Ωcm for $x_F$ being of 50, 100, and 150 µm, respectively.

Figure 5C:
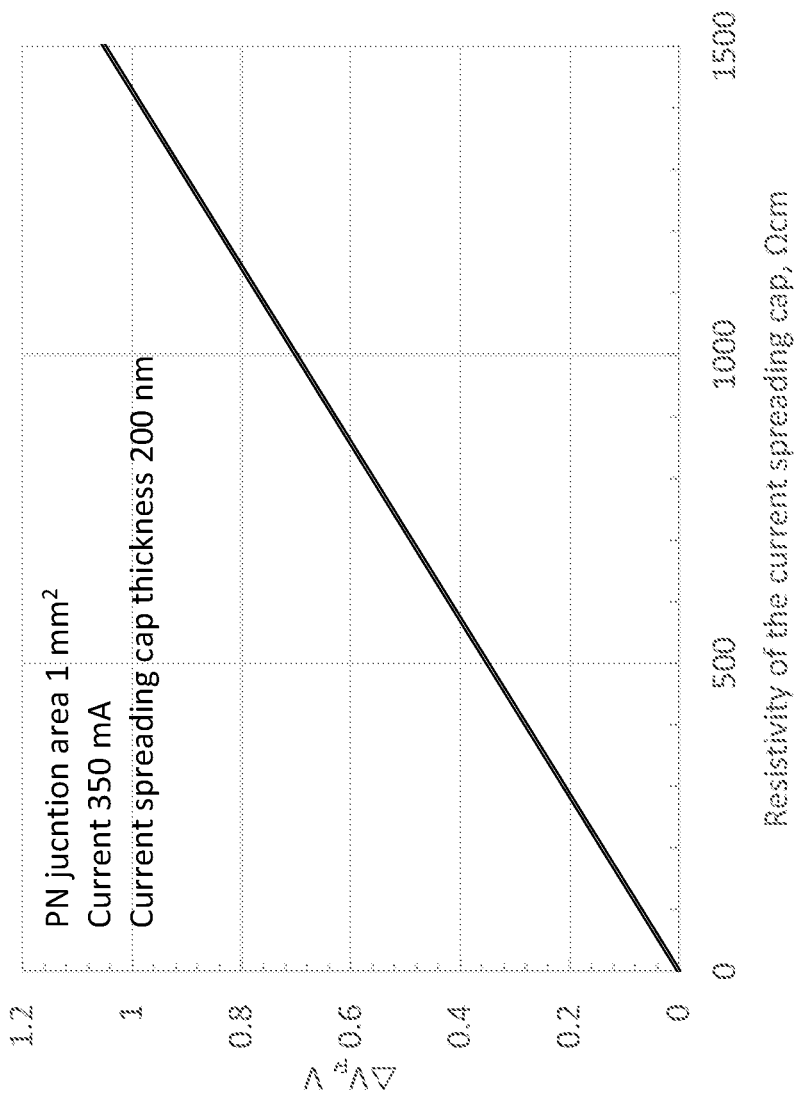
FIG. 5C plots the forward voltage increase of an embodiment LED as function of the resistivity of the current spreading cap.

FIG. 5C plots the forward voltage increase ($\Delta V_F$) of a disclosed LED as function of the resistivity of the current spreading cap. Here the LED p-n junction area, forward current, and current spreading cap thickness are fixed to be 1.0 mm², 350 mA, and 0.2 µm, respectively. $\Delta V_F$ increases linearly with $\rho_c$ the resistivity of the current spreading cap. In practice, the desired $\Delta V_F$ is limited to less than 0.5 V, or less than 0.3 V, or less than 0.2 V, therefore the required minimal resistivity of the current spreading cap is less than ~715, 430, and 290 Ωcm, respectively. These numbers translate that, if $R_{n\square}=80\Omega$ (e.g., for UVC LEDs), the maximal allowed mesa half width $x_F$ are limited to be ~133, 103, and 85 µm, respectively; if $R_{n\square}=8\Omega$ (e.g., for visible LEDs), the maximal allowed mesa half width $x_F$ are limited to be ~422, 327, and 269 µm, respectively.

GaN and AlGaN layers of these resistivities (i.e., a few tens to thousands Ωcm) are not easy to obtain. Another aspect of the present disclosure is to provide methods to form GaN and AlGaN layers as current spreading caps of resistivity of a few tens to thousands Ωcm.

According to one embodiment, depending on the minimal resistivity demanded by inequality (1), current spreading cap 36 can be unintentionally doped, lightly Si-doped (e.g., doping level in the $10^{15}$-$10^{17}$ cm$^{-3}$ range), or intentionally doped with deep level impurities such as carbon (C) and/or iron (Fe) (doping level $10^{17}$-$10^{19}$ cm$^{-3}$ range) to increase the resistivity. According to another embodiment, current spreading cap 36 can include at least an AlGaN layer of high Al-content, with Al-content being 70% or above, for example, being 70%-100%, or 75%-95%. This is to ensure that the dopant activation energy in current spreading cap 36 is deep that the resistivity can be controlled via intentionally n-type doping, such as Si-doping. The resistivity of current spreading cap 36 can be accessed via Van der Pauw Hall effect measurement, which is a technique commonly used to measure the resistivity and the Hall coefficient of an approximately two-dimensional sample (i.e., the sample thickness much less than its lateral dimensions) in the semiconductor field of interest. If current spreading cap 36 is made of a high-Al-content AlGaN layer, whose mobility are known to be in the range of 30-60 cm²/(v.s), for example, 50 cm²/(v.s), then, a carrier concentration in the range of $1\times10^{14}$-$1.0\times10^{16}$ cm$^{-3}$ will indicate a resistivity 12.5-1250 Ωcm. Here the carrier concentration can be measured via capacitance-voltage (C-V) profiling, which is a well-known technique for characterizing semiconductor materials and devices.

Figure 6A:
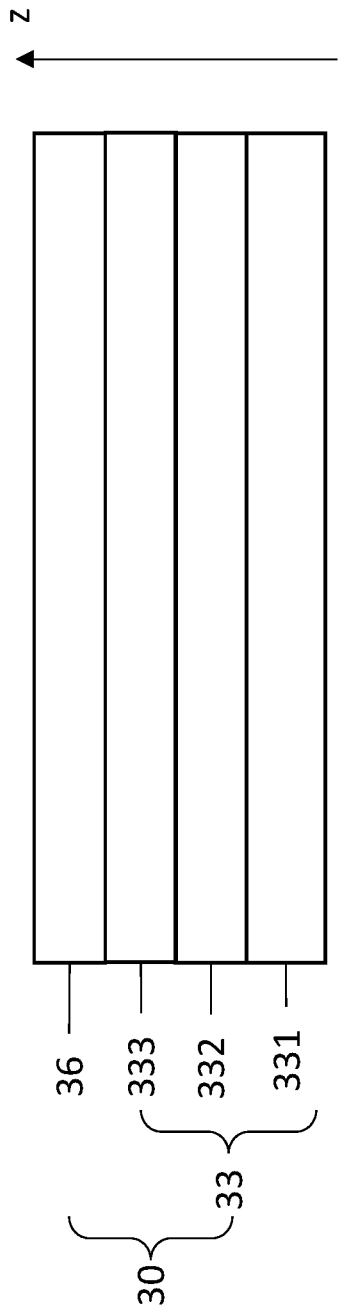
FIG. 6A illustrates a laminate structure of a current spreading structure according to one aspect of the present disclosure.
Figure 6B:
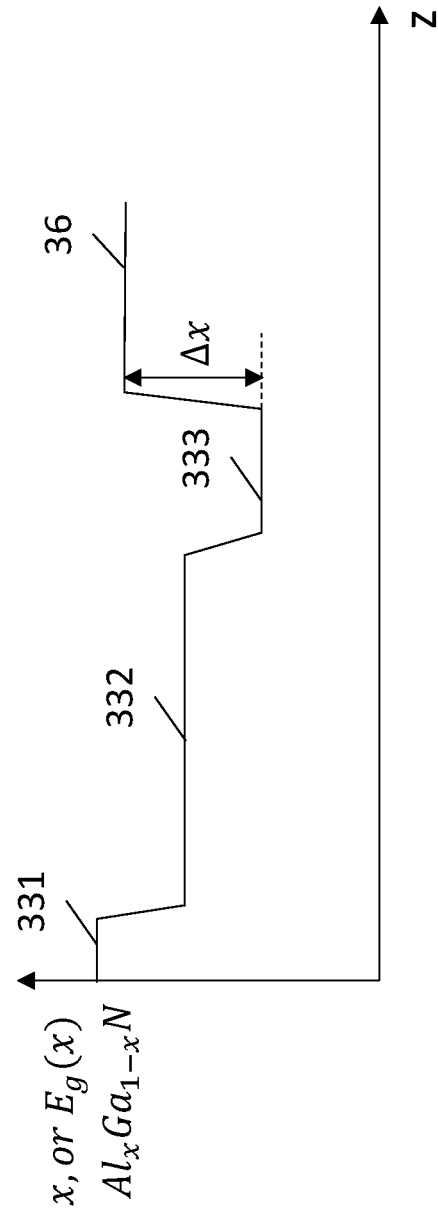
FIG. 6B illustrates the Al-content of the current spreading structure given in FIG. 6A.

Illustrated in FIG. 6A is a laminate structure of a current spreading structure 30 made of $Al_xGa_{1-x}N$ according to one aspect of the present disclosure, with an illustrative Al-content profile given in FIG. 6B, which can also be viewed as an illustrative bandgap ($E_g(x)$) profile of the $Al_xGa_{1-x}N$ current spreading structure 30. The current spreading base 33 includes three layers, i.e., layer 331, layer 332 and layer 333. Layer 331 can be formed on template 20 so its Al-content is close to that of the template 20. If template 20 is made of AlN, the Al-content of layer 331 can be close to AlN, i.e., in the range of 70-100%, or 80-95%. Layer 331 can be Si-doped. Layer 332 is the main block for current spreading base 33, can be of less Al-content (hence $E_g$) as compared to layer 331. For UVC LEDs, the Al-content of layer 332 can optionally be in the range of 58-65%. Layer 332 is of thickness in the range of 1.0-3.0 µm, and doped with Si of concentration $5$-$15\times10^{18}$ cm$^{-3}$ to provide good conductance. Formed on layer 332 is layer 333, serving as n-type contact layer to receive n-contact 80. In order to form good ohmic contact to n-contact 80, layer 333 is of the lowest Al-content (hence $E_g$) as compared to layers 331, 332, and is heavily doped with Si, with concentration in the range of $6$-$25\times10^{18}$ cm$^{-3}$. Layer 333 optionally is of thickness 100-500 nm, or 150-400 nm. Current spreading cap 36 has a resistivity $\rho_c$ optionally satisfying inequality (1). Or, as a rule of thumb, according to one aspect of the present invention, the resistivity of the current spreading cap 36 is at least 1000 times of that of the current spreading base 33. Cap 36 can be of the same Al-content as that of layer 332, or have Al-content (hence $E_g$) higher than that of layer 332. In some UVC LED embodiments, the Al-content of layer 333 can be 52-58% (e.g., 55%), and Al-content of current spreading cap 36 is 70-85% (e.g., 76%). The Al-content difference, $\Delta x$, between cap 36 and layer 333 is at least 10%, or 15%, or 20%, or 25%. The Al-content of cap 36 being higher than that of layer 333 can generate interface positive charges due to polarization discontinuity, adding an additional mechanism to cause electrons to spread laterally to form a two-dimensional electron gas within layer 333 in the vicinity of the layer 333/cap 36 interface.

Figure 7A:
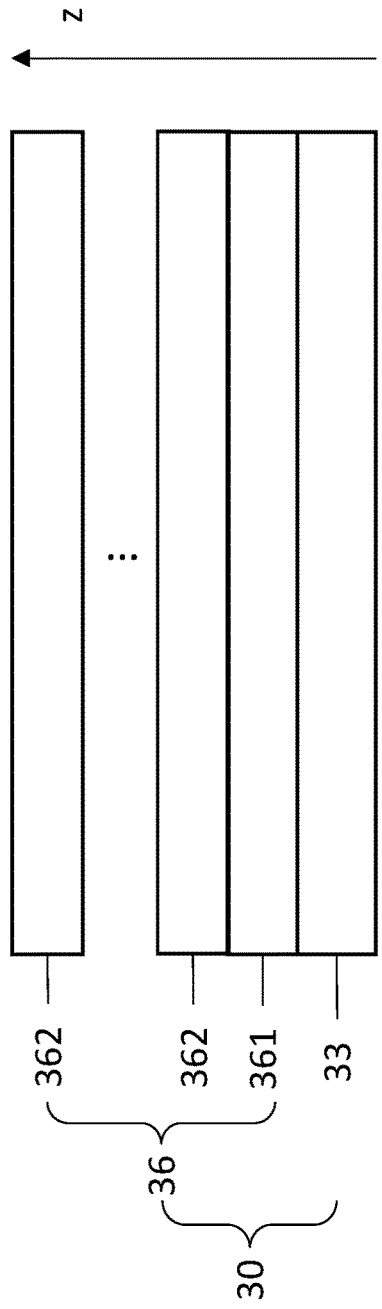
FIG. 7A illustrates a laminate structure of a current spreading structure according to one aspect of the present disclosure.
Figure 7B:
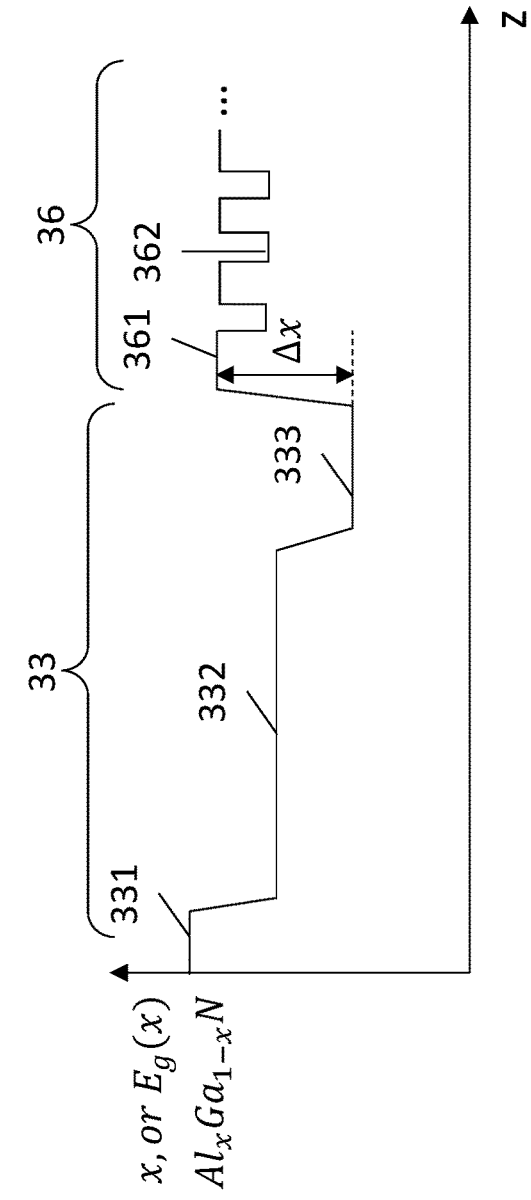
FIG. 7B illustrates the Al-content of the current spreading structure given in FIG. 7A.

Illustrated in FIG. 7A is a laminate structure of another current spreading structure 30 made of $Al_xGa_{1-x}N$ according to one aspect of the present disclosure, with an illustrative Al-content profile given in FIG. 7B. As seen, the current spreading cap 36 includes multiple layers, i.e., include a periodic laminate structure made of alternatively stacking layers 361 and 362 for multiple times, e.g., for 3-5, or more times. Layer 361 may have higher Al-content than layer 362. This arrangement makes electrons in current spreading cap 36 have additional lateral spreading capability. For example, layers 361 and 362 can have respective Al-content of 80% and 65%. Therefore, the interface charges arising from polarization discontinuity and the band gap discontinuity between layer 361 and layer 362 will cause electrons to spread laterally. Cap 36 can be made of layer 361 and layer 362 without being a periodic laminate structure. The Al-content difference, $\Delta x$, between layer 361 and layer 333 is at least 10%, or 15%, or 20%, or 25%.

Embodiments of UVC LEDs with current spreading structures 30 are described using a semiconductor layer formation technology called metalorganic chemical vapor deposition (MOCVD). For AlGaN MOCVD, usually trimethylaluminum (TMA), trimethylgallium (TMG) and ammonia are used as aluminum (Al), gallium (Ga) and nitrogen (N) sources, respectively.

Illustrated in FIG. 2A is a cross-sectional schematic view of a UV LED structure formed over a substrate 10 according to an embodiment of the present invention. Substrate 10 can be made from c-plane sapphire. Formed over substrate 10 is an AlN template 20, which can be made of a thick AlN layer, for example, with a thickness of 1.5-6.0 µm to fully coalesce on the substrate 10. Formed over template 20 is a thick n-AlGaN current spreading structure 30 for electron supply and n-type ohmic contact formation. Structure 30 may include a current spreading base 33 and a current spreading cap 36. And the current spreading base 33 includes a thin (0.2-0.5 µm such as 0.4 µm, $n=2.0 \times 10^{18}$-$6.0 \times 10^{18}$ cm$^{-3}$) n-type N-AlGaN layer 331, a thick (1.0-5.0 µm such as 1.3 µm, $n=2.0 \times 10^{18}$-$9.0 \times 10^{18}$ cm$^{-3}$) n-type N-AlGaN layer 332 for current spreading, a heavily n-type doped (0.2-0.8 µm such as 0.40 µm, $n=8 \times 10^{18}$-$2 \times 10^{19}$ cm$^{-3}$) N$^+$-AlGaN layer 333 for current spreading and to receive n-contact 80. The Al-contents of the layers 331, 332 and 333 are respectively 73%, 64% and 55%. Formed on the current spreading base 33 is a ~0.15 µm current spreading cap 36, which is unintentionally doped and of Al-content ~70%. Formed on cap 36 is layer 38, an Al0.7Ga0.3N of ~10 nm-thick and doped with Si at $1.5 \times 10^{19}$ cm$^{-3}$ for MQW active-region polarization field screening. Formed on layer 38 is active-region 40, made of $Al_bGa_{1-b}N/Al_wGa_{1-w}N$ bN/$Al_wGa_{1-w}N$ multiple-quantum-well (MQW). Active-region 40 is made of alternatingly stacked n-$Al_bGa_{1-b}N$ barrier and $Al_wGa_{1-w}N$ well for a few times, for example, for 3-8 times. The barrier thickness is in the range of 8-16 nm, and the well thickness is 1.2-5.0 nm. The total thickness of active region 40 is usually less than 200 nm, for example, being 75 nm, 100 nm, or 150 nm. The n-$Al_bGa_{1-b}N$ barrier and $Al_wGa_{1-w}N$ well may have an Al-composition in the range of 0.3-1.0, and 0.0-0.85, respectively, and the Al-composition difference of the barrier and well is at least 0.15, or so to ensure a barrier-well bandgap difference ($\Delta E_g$) of at least 400 meV to secure quantum confinement effect. Following active-region 40 is a p-type AlGaN structure 50. Structure 50 can be a p-AlGaN layer of uniform or varying Al-composition, or a p-AlGaN superlattice structure, or a p-AlGaN MQW structure, or a p-AlGaN multilayer structure serving as hole injecting and electron blocking layer. Structure 50 has enough Al-composition and modulation to allow for sufficient electron blocking and hole injection efficiencies. Further, structure 50 is also efficient in spreading hole current laterally. Structure 50 may also contain a p-contact layer to receive p-contact 70. Briefly, the p-contact layer can be a thin (0.6-2.0 nm), strained, and heavily acceptor-doped nitride layer (e.g., Mg-doped, or Mg and Si co-doped to a concentration about $10^{19}$-$10^{20}$ cm$^{-3}$ or more). For UVB/UVC LEDs (emissions from 200 nm-315 nm), the p-contact layer prefers to be a Mg-doped AlGaN layer with Al-composition larger than 0.4, or with Al-composition to be from 0.45 to 1.0. P-contact 70 forms p-ohmic contact to p-type structure 50, and optionally is a p-ohmic contact and reflector as well. For example, P-contact 70 may include a rhodium layer, or a palladium layer, optionally, also include a 2-8 µm gold layer or gold tin layer.

Also formed on current spreading base 33 is an n-contact 80, which can be made of thin metal layer stacks such as titanium/aluminum/titanium/gold (Ti/Al/Ti/Au) with respective layer thickness of 30-40/70-80/10-20/80-100 nm, for example 35/75/15/90 nm, or V/Al/V/Ag, V/Al/V/Au, and V/Al/Ti/Au, of respective thicknesses such as 20/60/20/100 nm. As seen from FIGS. 6B and 7B, n-contact 80 is preferred to be formed on the heavily n-type doped N$^+$-AlGaN layer 333. N-contact 80 may also include a thick (2-10 µm) gold or gold tin layer.

Figure 8:
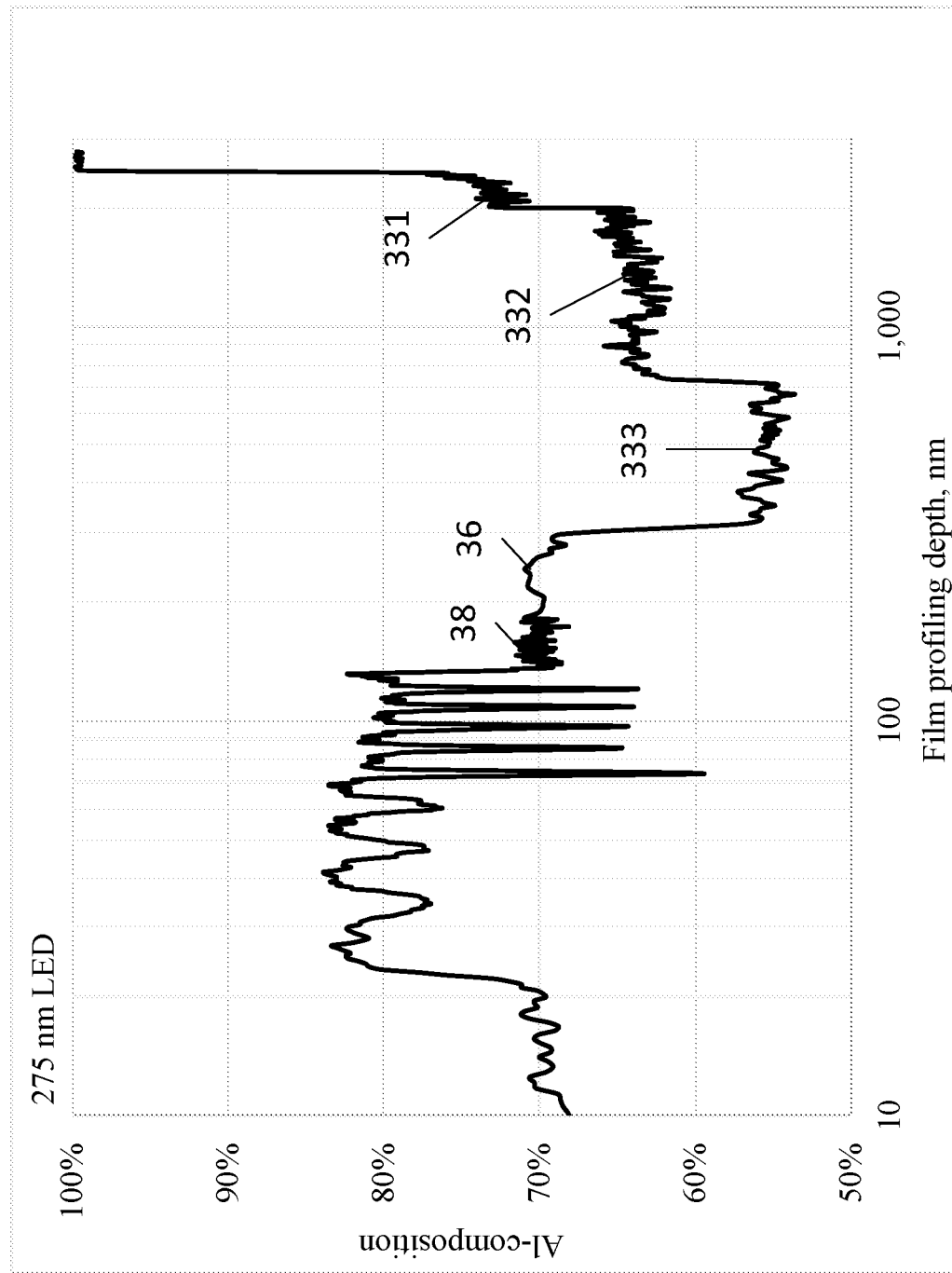
FIG. 8 is a plot of a part of the Al-composition profile of a UV LED according to one aspect of the present disclosure.
Figure 9:
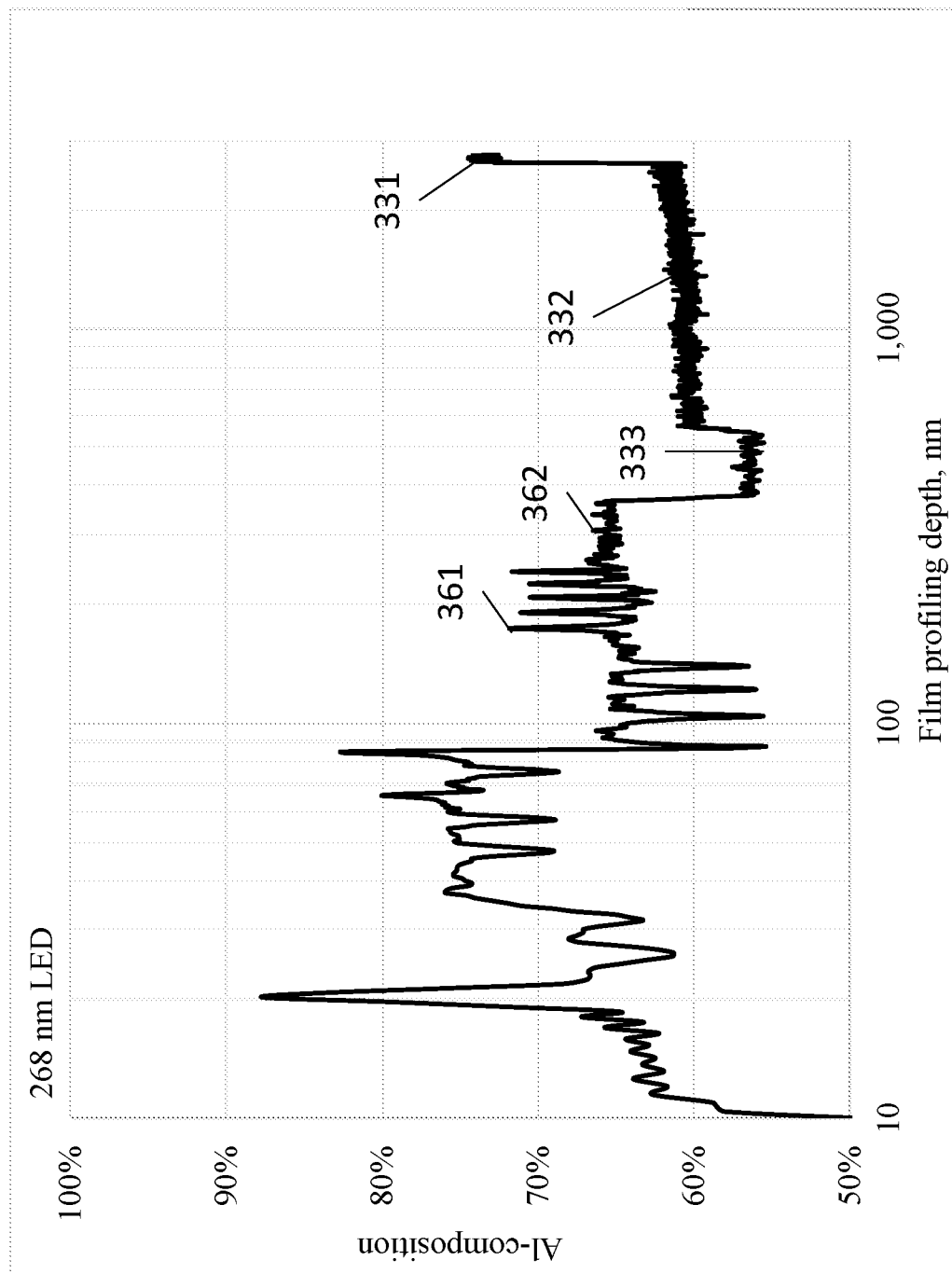
FIG. 9 is a plot of a part of the Al-composition profile of a UV LED according to one aspect of the present disclosure.

Plotted in FIGS. 8 and 9 are the Al-content profiles for a 275 nm and a 268 nm UVC LED embodiments of the present invention. The 275 nm LED utilizes a current spreading cap 36 made of a single $Al_{0.7}Ga_{0.3}N$ layer, while the 268 nm LED has a current spreading cap 36 made of multiple AlGaN layers including a layer 362, and a laminate structure made of periodically stacking of layer 361/362 four times. The Al-content profiles in FIGS. 8 and 9 were measured by energy dispersive X-ray spectroscopy in a cross-sectional transmission electron microscopy system.

The present invention has mostly used UVC LEDs as exemplary embodiments. However, it is to be understood that the scope of the present invention is not limited to the disclosed embodiments. On the contrary, it is intended to cover various modifications and similar arrangement or equivalents which can be obtained by a person skilled in the art without creative work or undue experimentation. The scope of the claims, therefore, should be accorded the broadest interpretation so as to encompass all such modifications and similar arrangements and equivalents.

The invention claimed is:

1. An apparatus, comprising:
   a current spreading base with at least one n-contact, the current spreading base having a small n-type resistivity to promote lateral electron flow;
   a current spreading cap on top of the current spreading base, the current spreading cap with a large n-type resistivity to suppress vertical electron flow and promote lateral electron flow, wherein the current spreading cap has a resistivity of a few tens to thousands of Ωcm and the current spreading cap includes multiple layers of different bandgaps;
   a light-emitting active region on top of the current spreading cap; and
   a p-type structure on top of the light-emitting active region with a p-contact.

2. The apparatus of claim 1 wherein the resistivity of the current spreading cap is at least 1000 times of that of the current spreading base.

3. The apparatus of claim 1 wherein the current spreading base includes a high bandgap layer and a low bandgap layer, and the n-contact is formed on the low bandgap layer of the current spreading base.

4. The apparatus of claim 3, wherein the bandgap of the current spreading cap is larger than that of the low bandgap layer of the current spreading base.

5. The apparatus of claim 1 wherein the p-contact defines a light-emitting mesa of width $2x_F$ formed in-between two n-contacts, the sheet resistance $R_{n\square}$ of the current spreading base is experimentally established, the half width $x_F$ of the mesa is selected and the current spreading cap thickness $h_c$ is selected to collectively promote uniform current injection into the active region.

6. The apparatus of claim 1 wherein the p-contact defines a light-emitting region facing at least two n-contacts, the separation of the at least two n-contacts projecting a width of $2x_F$ to the p-contact, the sheet resistance $R_{n\square}$ of the current spreading base is experimentally established, the half width $x_F$ of the separation of the at least two n-contacts projecting to the p-contact is selected and the current spreading cap thickness $h_c$ is selected to collectively promote uniform current injection into the active region.

7. The apparatus of claim 5 wherein minimum resistivity of the current spreading cap is proportional to the sheet resistance $R_{n\square}$ of the current spreading base and $x_F^2$.

8. The apparatus of claim 5 wherein minimum resistivity of the current spreading cap is inversely proportional to the current spreading cap thickness $h_c$.

9. The apparatus of claim 6 wherein minimum resistivity of the current spreading cap is proportional to the sheet resistance $R_{n\square}$ of the current spreading base and $x_F^2$.

10. The apparatus of claim 6 wherein minimum resistivity of the current spreading cap is inversely proportional to the current spreading cap thickness $h_c$.

11. The apparatus of claim 1 wherein the current spreading cap is formed of GaN.

12. The apparatus of claim 1 wherein the current spreading cap is formed of AlGaN.

13. The apparatus of claim 1 configured as a group-III nitride light-emitting diode.

14. An apparatus, comprising:
  a current spreading base with at least one n-contact, the current spreading base having a small n-type resistivity to promote lateral electron flow;
  a current spreading cap on top of the current spreading base, the current spreading cap with a large n-type resistivity to suppress vertical electron flow and promote lateral electron flow;
  a light-emitting active region on top of the current spreading cap;
  a p-type structure on top of the light-emitting active region with a p-contact;
  a template layer attached to the current spreading base; the template layer has a roughened surface for light extraction; and,
  n-contacts extending from the template layer into the current spreading base.

15. The apparatus of claim 14 wherein the current spreading cap is doped with impurities to increase resistivity.

16. The apparatus of claim 15, wherein the impurities are silicon (Si), carbon (C) or iron (Fe).

17. The apparatus of claim 1 wherein the current spreading base includes multiple layers.

18. The apparatus of claim 4 wherein the bandgap is affected by Al-content and Al-content differences between the current spreading cap and the low bandgap layer of the current spreading base is at least 10%.

19. The apparatus of claim 4 wherein the current spreading base and current spreading cap are made of AlGaN, and the Al-content of the current spreading cap is more than 70%.

20. The apparatus of claim 1, wherein there is a heavily n-type doped layer in-between the current spreading cap and the light-emitting active-region.

* * * * *